US005660697A

United States Patent [19]

Kawashima et al.

[11] Patent Number: 5,660,697

[45] Date of Patent: Aug. 26, 1997

[54] ELECTROLUMINESCENT DISPLAY DEVICE AND METHOD OF MANUFACTURING SAME

[75] Inventors: Tomoyuki Kawashima, Yokohama; Harutaka Taniguchi; Hisato Kato, both of Yokosuka; Kazuyoshi Shibata, Yokohama, all of Japan

[73] Assignee: Fuji Electric Co., Ltd., Tokyo, Japan

[21] Appl. No.: 460,395

[22] Filed: Jun. 2, 1995

Related U.S. Application Data

[62] Division of Ser. No. 931,701, Aug. 18, 1992, abandoned.

[30] Foreign Application Priority Data

Aug. 20, 1991 [JP] Japan .................................... 3-207071

[51] Int. Cl.[6] .............................. H05H 1/24; B05D 5/12; C23C 14/06; C30B 28/14

[52] U.S. Cl. ................................ 204/192.22; 204/192.23; 427/576; 427/579; 427/70; 427/126.3; 117/89; 117/101; 117/108; 313/509

[58] Field of Search ................................ 427/66, 70, 563, 427/564, 576, 579, 586, 126.3; 204/192.22, 192.23; 313/506, 509, 505, 501; 315/169.3; 340/752, 760, 754; 345/76, 77, 45; 117/89, 92, 101, 108

[56] References Cited

U.S. PATENT DOCUMENTS

| | | | |
|---|---|---|---|
| 4,207,617 | 6/1980 | Yasuda et al. | 365/111 |
| 4,312,921 | 1/1982 | Hirai et al. | 428/446 |
| 4,342,945 | 8/1982 | Ketchpel | 313/505 |
| 4,401,697 | 8/1983 | Strangman | 427/248.1 |
| 4,647,813 | 3/1987 | Kitabayashi et al. | 313/509 |
| 4,857,802 | 8/1989 | Fuyama et al. | 313/506 |
| 4,897,628 | 1/1990 | Ippommatsa et al. | 338/34 |
| 4,907,043 | 3/1990 | Uekita | 427/66 |
| 4,924,144 | 5/1990 | Menn et al. | 313/505 |
| 5,006,365 | 4/1991 | Nive et al. | 427/66 |
| 5,056,099 | 10/1991 | Bradley | 372/49 |
| 5,107,174 | 4/1992 | Galluzzi et al. | 313/503 |
| 5,245,471 | 9/1993 | Iwatsuka et al. | 427/163 |
| 5,397,744 | 3/1995 | Sumi et al. | 437/200 |

OTHER PUBLICATIONS

S. Sivaram, *Chem. Vap. Dep. Thermal & Plasma Deposition of Electronic Materials* except pp. 214–216, Van Nostrand Reinhold pub., N.Y. 1995 (no month).

John A. Thornton, "Influence of apparatus geometry & deposition conditions on the structure and topography of thick sputter coatings," *J. Vac. Sci Technol.*, vol. 11, No. 4 Jul./Aug. 1974 pp. 666–670.

*Primary Examiner*—Marianne Padgett
*Attorney, Agent, or Firm*—Brumbaugh, Graves, Donohue & Raymond

[57] ABSTRACT

An electroluminescent display device with decreased voltage requirements comprises:

(a) a substrate having a major surface;

(b) a first electrode disposed over the major surface of the substrate;

(c) a first insulating film disposed over the first electrode;

(d) a light-emitting film disposed over the first insulating film;

(e) a second insulating film disposed over the light-emitting film; and (f) a second electrode disposed over the second insulating film. The insulating films have a columnar structure oriented perpendicular to an electric field formed between the two electrodes, and either of the insulating films may be omitted.

2 Claims, 2 Drawing Sheets

ELECTROLUMINESCENT DISPLAY DEVICE AND METHOD OF MANUFACTURING SAME

This application is a division of application Ser. No. 07/931,701, filed on Aug. 18, 1992 now abandoned.

BACKGROUND OF THE INVENTION

This invention relates to improved electro-luminescent display devices and to a method of manufacturing such devices.

Electroluminescent display devices are known for use in calculators and the like. These devices are made of thin film laminates which incorporate a light-emitting film of a material such as zinc sulfide doped with manganese or rare earth elements which emits light in response to an applied electric field. These display devices utilize a "flat panel" construction whereby variable displays on a large screen are made possible through the incorporation of a large number of light-emitting picture elements arranged in matrix form.

In making such a device, it has been recognized that the light-emitting efficiency of the light-emitting film decreases when the electric field is applied directly to the film. Insulation films have therefore been incorporated into the device separating the light-emitting film from the electrodes. Such a device is shown in FIG. 4.

In FIG. 4, an electroluminescent device 10 is formed from a substrate 1 on which an array of transparent electrodes 2 is formed. The substrate 1 is a transparent insulating material, such as glass. The electrodes 2 are formed from a transparent conductive material such as indium tin oxide and are formed as a plurality of substantially parallel stripes on the surface of the substrate.

Over the electrodes 2 are formed an insulating film 3 formed from inorganic insulators such as silicon nitride and having a thickness of several thousand Angstroms; a light-emitting film 4 having a thickness of several thousand Angstroms; a second insulating film 5 similar to insulating film 3 and a second electrode array 6. The second electrode array is arranged at right angles to the first electrode 2 and may be made of a metal such as aluminum.

The display voltage DV applied to the electroluminescent device is applied across the transparent electrode array 2 and the second electrode array 6 such that the polarities normally switch between positive and negative within each frame cycle on the display as shown in FIG. 4. Under these conditions, the light-emitting film emits light DL through the substrate 1 at the crossing points of the two electrode arrays.

This electroluminescent device suffers from a serious drawback, however, because the display voltage required to drive the device is so high that the driving circuit tends to be large and thus of greater cost. In particular, in the case of the device as shown in FIG. 4, a display voltage of 200 V or greater is required for a display with a practical level of luminescence. As a result, a breakdown voltage of about 300 V is required for the integrated circuit device in order to drive the display. This increases the size of the chip and results in unavoidably higher costs.

The simplest way to reduce the display voltage in the electroluminescent device is to reduce the entire thickness of the laminated structure. However, even if the thickness of the light-emitting film 4 is reduced to the minimum required to obtain reasonable luminance (4000 to 5000 Å) and the insulating films 3 and 5 are made at a thickness of 3000 Å which raises their internal electric field intensity to $10^5$ V/cm or higher, it is still difficult to keep the display voltage below 200 V. Thinner insulating films introduces increased risk of insulation failure during operation and thus is not really acceptable. Similarly, the omission of one of the insulating films does not solve the problem because it becomes necessary to increase the thickness of the remaining insulating film.

It is an object of the present invention to provide electroluminescent devices and a method for their manufacture which have a reduced display voltage requirement without loss of reliability.

SUMMARY OF THE INVENTION

In accordance with the claimed invention, an electroluminescent display device is formed from:

(a) a substrate having a major surface;

(b) a first electrode disposed over the major surface of the substrate;

(c) a light-emitting film disposed over the first electrode;

(d) a second electrode disposed over the light-emitting film; and (e) at least one insulating film disposed on one side of the light emitting film, preferably between the first electrode and the light-emitting film, or on both sides of the light-emitting film. By forming the insulating film with a columnar structure oriented in the direction of an electric field generated between the first and second electrode, a device which requires a lower voltage is achieved. This structure can be obtained by controlling the pressure during plasma deposition of the insulating layers.

DETAILED DESCRIPTION OF THE INVENTION

Figure 1:
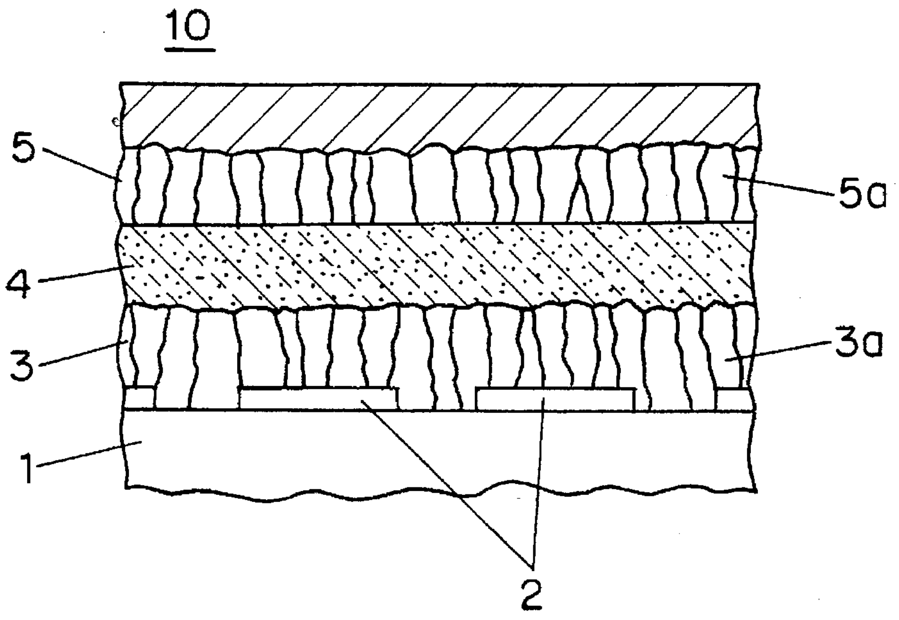
FIG. 1 shows one embodiment of an electroluminescent device in accordance with the invention.
Figure 4:
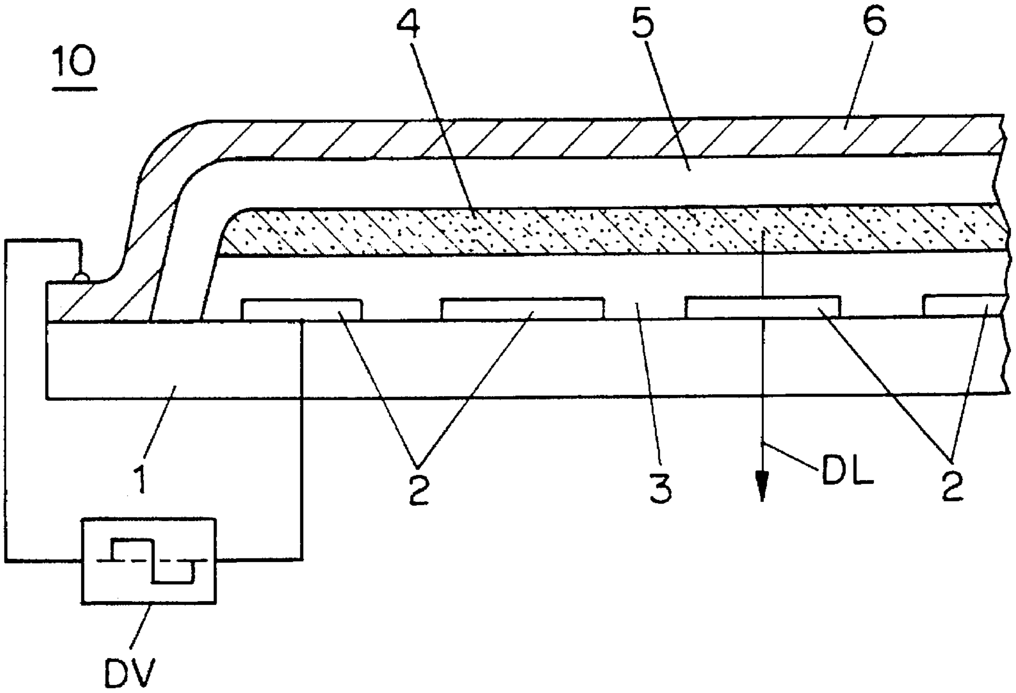
FIG. 4 shows the basic structure of an electro-luminescent device.

An electroluminescent device in accordance with the invention is shown in FIG. 1 wherein like numbers are assigned to the same structures as in FIG. 4.

The various parts of the electroluminescent device of the invention can be made from materials known in the art for use in electroluminescent devices. The substrate 1 can be made from transparent materials such as glass. The transparent electrode array 2 can be made from transparent conductive materials such as indium tin oxide. The second array of electrodes 6 can be formed from any conductive material and is advantageously made of aluminum.

The light-emitting film 4 is suitably made from a base material such as zinc sulfide, calcium sulfide or strontium sulfide doped with a material which provides light-emitting centers. Suitable materials include manganese or various rare earth elements depending on the color of emission desired. This film can be formed by an electron beam vapor deposition process.

The insulating films are suitably formed from inorganic insulators such as silicon nitride, tantalum oxide, yttrium oxide, alumina and silicon oxide. The insulating film or films may be formed by depositing the insulating substance in a plasma atmosphere under conditions which permit the growth of columnar crystals up to a height corresponding to the insulation film thickness. In the case of silicon nitride the minimum pressure for formation of columnar crystals is 20 mTorr. For tantalum oxide, the minimum pressure is about 40 mTorr.

A preferred method for forming the insulating films involves the use of reactive sputtering. The target in such a method is composed principally of the metal component of the insulating substance, e.g. silicon or tantalum. A plasma CVD process using a reactive gas mixed with the constituent gas of the organic insulation substance, or a sputtering process using the insulation substance as a target can also be used. Furthermore, it is possible to improve the deposition velocity by heating the target with an electron beam.

One embodiment of a display device in accordance with the invention is shown in partially expanded cross-section in FIG. 1.

The display device 10 of the present invention as shown in FIG. 1 has an array transparent electrode film 2 with a thickness of about 2000 Å made of indium-tin oxide or the like formed on top of the transparent insulating substrate 1. An inorganic substance such as silicon nitride or tantalum oxide is deposited as the insulating film 3 with a thickness of, e.g. 3000 Å and is formed of columnar crystals 3*a* grown to a height corresponding to the film thickness as shown. The light-emitting film 4 is disposed above the insulating film and may have the same structure composition as do conventional devices. For example, a light-emitting film may be formed of zinc sulfide containing manganese at 0.5% as the light-emitting centers with a thickness of 5000 Å using a usual electron beam deposition process. Said film is then heat-treated at a temperature of 500° to 600° C. to activate the light-emitting cores.

The insulating film 5 disposed over the light-emitting film 4 may be omitted as a case requires or may be an extremely thin protective film. However, in the embodiment shown in FIG. 1, the insulation film 5 has a thickness of 3000 Å and is formed of columnar crystals 5*a* as in the insulating film 3. The back electrode array 6 made of aluminum formed in a stripe pattern perpendicular to the transparent electrode array 2 has a thickness of about 5000 Å and is formed over the insulation film 5 as has previously been done in conventional devices.

In the display device 10 of the present invention thus constructed, the insulating films 3 and 5 having a texture consisting of columnar crystals 3*a* and 5*a* have a dielectric constant of at least several times higher than that in conventional devices. For example, the dielectric constants is considerably higher than that of the light-emitting film 4 having dielectric 20 to 30.

The dielectric constant of the insulating film is significant because the display voltage applied to the laminated structure of light-emitting film and the insulation films is shared by both parts mainly via the so-called capacitance split. The portion of the voltage shared by each film is proportional to the film thickness, and inversely proportional to the dielectric constant. Therefore, if the dielectric constant for the insulation film is raised, the voltage share thereof is reduced and the voltage share of the light-emitting film increases by that amount. The utilization of the display voltage thus improves, and the display voltage that has to be supplied to the lamination structure with the insulation films to apply the required voltage to the light-emitting film to obtain the desired luminance is reduced.

In fact, the display voltage required to drive the display device of the thin film laminated structure can be reduced to less than half of what has been required by conventional devices. In addition, the electric field intensity applied to the insulation films 3 and 5 is reduced thereby reducing the risk that the insulating films 3 and 5 will suffer from insulation breakdown during the use of the display device. As a result, the long-term reliability of the device is improved.

Figure 2:
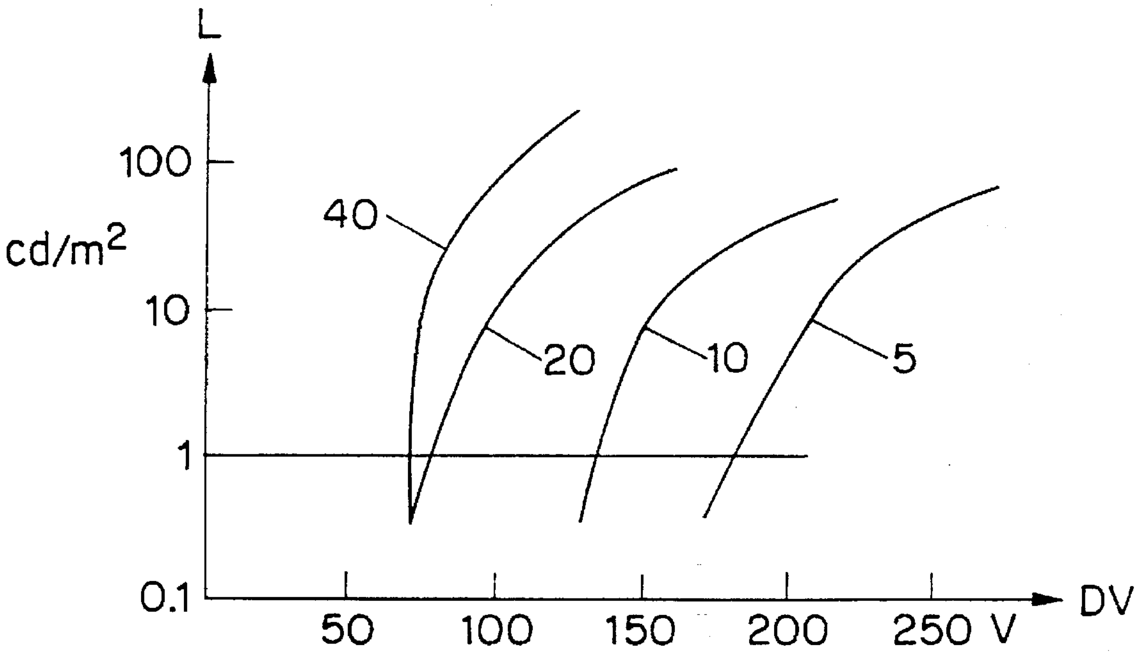
FIG. 2 shows a light-emitting characteristics graph showing the results of experiments in which silicon nitride is deposited as the inorganic insulation substance for an insulation film.

FIG. 2 shows the results of an experiment in terms of the light-emitting characteristics on several display devices with the same configuration as the one shown in FIG. 1. In the devices tested, silicon nitride was employed 5 as the inorganic insulation material for the insulation films 3 and 5. Each curve corresponds to a different insulating film-forming condition. The horizontal axis in FIG. 2 shows the display voltage DV while the vertical axis shows the device luminance L of the light-emitting film 4 expressed in terms of $cd/cm^2$ (where cd stands for candelas, a unit of measurement of luminous intensity). In the experiment, silicon nitride was deposited on the test pieces, maintained under a normal temperature at a sputtering electric power density of high frequency for plasma generation at 5 $W/cm^2$, via a sputtering process using silicon as the target, and nitrogen as the sputtering gas, and varying the atmospheric pressure within a range from 5 to 40 mTorr during the discharge. The parameters for the characteristics 5, 10, 20 and 40 in the figure show atmospheric pressures expressed in mTorr. Since it is usual for the display voltage DV to be used for the luminance of L of 1 $cd/cm^2$ as the evaluation criterion for the light-emitting characteristics of an display device, the display voltage DV as used hereunder will also use this definition for the sake of convenience.

As can be seen from FIG. 2 while the display voltage DV is about 140 V or higher when an atmospheric pressure of 10 mTorr or lower was used for the silicon nitride deposition, the display voltage DV in the case where a pressure of 20 mTorr or higher was used is reduced to 80 V or lower. The cause for this reduction is thought to lie in the crystalline structure of the deposited silicon nitride. A pressure of 10 mTorr or lower produces an amorphous or a near amorphous structure, while a pressure of 20 mTorr or higher produces a structure integrated into columnar crystals as shown graphically in FIG. 1. This difference appears appreciably in the dielectric constant, which is measured at about 10 for the case where a pressure of 10 mTorr or lower was used, while as high as 80 for the latter case where a pressure of 20 mTorr or higher was used. Although the experimental results in FIG. 2 alone could not accurately determine the atmospheric pressure during a deposition at which silicon nitride will change into this type of structure, a pressure of about 20 mTorr may be used as a target for the limit pressure.

Again the characteristics in FIG. 2 alone would not define it necessarily clearly, but the light-emitting threshold will vary, of course, depending on the difference in the silicon nitride structure. Hence, the present invention enables the light-emitting threshold in the display device to be reduced. As seen from the FIG. 2, since the inclination in the light-emitting characteristics becomes steeper as the atmospheric pressure during the deposition is increased in the case where silicon nitride is used, the display voltage is reduced to less than half of the conventional requirement of previously known display device, which is used at a considerably higher luminance than 1 $cd/cm^2$.

Figure 3:
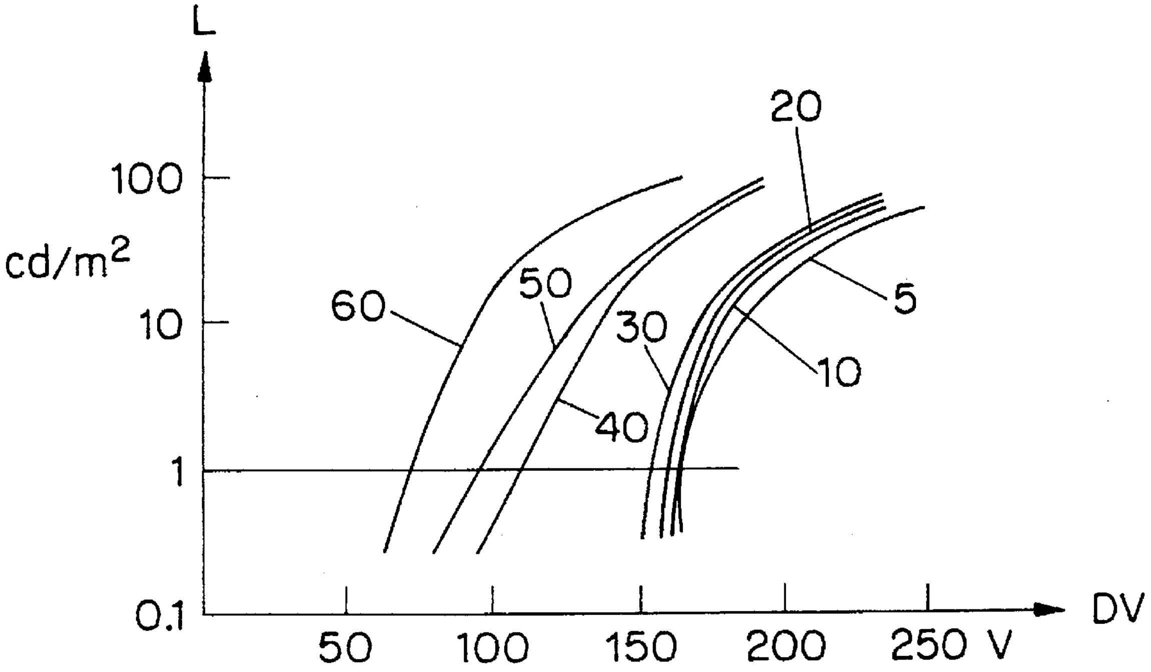
FIG. 3 shows a light-emitting characteristics graph showing the results of experiments in which tantalum oxide is deposited as the inorganic insulation substance for an insulation film.

FIG. 3 shows the results of an experiment depositing tantalum oxide while varying the film forming conditions in a similar manner as in FIG. 2. In this experiment, tantalum oxide was formed into a film with a thickness of 4000 Å for the insulating films 3 and 5 varying the atmospheric pressure between 5 and 60 mTorr under the same sample temperature and sputtering density as used for the previous samples, via a sputtering process using tantalum as the target, and using a sputtering gas of argon mixed with 30% oxygen. As is obvious from the figure, there is also a great difference in effect between a range of 5 to 30 mTorr and a range of 40 to 60 mTorr, with the display voltage DV becoming 150–160 V in the former; while being reduced to about half, 70 to 110 V, in the latter though with some variance. The limit value for the atmospheric pressure to distinguish both values is about 40 mTorr.

The deposited tantalum oxide has a mostly amorphous structure within a range of low atmospheric pressures, while the dielectric constant is about the same as that for the light-emitting film 4 at about 25, while the tantalum oxide has a texture of columnar crystals within a range of a high atmospheric pressure measuring 40 mTorr or higher. The dielectric constant of the columnar material was about 100 or higher, which is about four times higher than that for the light-emitting film 4. As can be understood from this fact, the present invention can also reduce the display voltage for the display device to less than half of the conventional requirement when tantalum oxide is used as the inorganic insulation substance for the insulation films 3 and 5. Furthermore, in either of the embodiments shown in FIG. 2 or FIG. 3, the dielectric constants for the insulation films 3 and 5 become several time that of the light-emitting film 4. Hence, it is possible to reduce the internal electric field intensity to one of the several fractions of conventional intensities, thus decreasing the possibility of an insulation breakdown.

The above embodiments have been explained for the case of depositing silicon nitride or tantalum oxide as an inorganic insulation substance for insulation film using the so-called reactive sputtering process in which silicon or tantalum as the main constituent is used as a target. However, in addition to this process, the plasma CVD process, which uses a reactive gas mixed with the constituent gas of the inorganic insulation substance or the sputtering process, which uses the inorganic insulation substance itself as a target, may be utilized to achieve a texture of columnar crystals in the inorganic insulation substance using nearly the same depositing conditions as described earlier. In addition, the kind of the inorganic insulation substance for the insulation film is not limited to silicon nitride or tantalum oxide, but rather, may include yttrium oxide, alumina, and silicon oxide through routine experimentation to determine the limiting pressure.

In the display device of the present invention as described above, by making the insulation films that make contact with the light-emitting film in the thin film laminated structure thin films of inorganic insulation substance having a texture of columnar crystals extending in the direction of an electric field generated by the display voltage, and by depositing the inorganic insulation substance of the insulation films that make contact with the light-emitting film in a plasma atmosphere under an atmospheric pressure above the limit pressure at which the columnar crystals grow to a height corresponding to the insulation film thickness, the following effects can be obtained.

(a) By forming the insulating film of well oriented columnar crystal, one raises, the dielectric constant more than several times that for conventional structures. This increases the ratio of the shared voltage in the light-emitting film as a result mainly on the capacity split in the display voltage applied to the lamination structure with a light-emitting film, and the utilization efficiency of the display voltage is improved, thereby reducing the display voltage required to drive the display device to half or less of the conventional requirement.

(b) By reducing the internal electric field intensity of the insulation films in inverse proportion to the dielectric constants using the dielectric constants of the insulation films that are elevated to more than several times of the conventional structure or raising the dielectric constant higher than in the case of light-emitting films, or by reducing (lower than in the case of the light-emitting film) the electric field intensity applied to the insulation film when the light-emitting film is given the electric field intensity required for a device illumination with the desired luminance, insulation breakdown in the insulation films is prevented, thereby improving the long-term reliability of the display device.

Since the columnar crystallization of the inorganic insulation substance for the insulation films requires only that the atmospheric pressure be raised during the deposition, the present invention enables a display device with its display voltage reduced by half to be provided at the same cost as conventional devices. Furthermore, by reducing the power consumption of the display, and additionally improving the long-term reliability of the display device, the present invention can be used more widely and represents a performance improvement of the display device used for calculators because it is small, lightweight, and self-luminescent.

We claim:

1. A method for making an electroluminescent display device, comprising:

sequentially depositing, on a major surface of a substrate, a plurality of layers comprising a first electrode layer, a silicon nitride insulating layer, a light emitting layer and a second electrode layer; wherein depositing the insulating layer comprises reactive sputter deposition formation of the silicon nitride insulting layer, at a pressure of at least 20 mTorr, thereby to form columnar crystals in the insulating layer.

2. A method for making an electroluminescent display device, comprising:

sequentially depositing, on a major surface of a substrate, a plurality of layers comprising a first electrode layer, a tantalum oxide insulating layer, a light emitting layer and a second electrode layer; wherein depositing the insulating layer comprises reactive sputter deposition formation of the tantalum oxide insulating layer, at a pressure of at least 40 mTorr, thereby to form columnar crystals in the insulating layer.

* * * * *

UNITED STATES PATENT AND TRADEMARK OFFICE

CERTIFICATE OF CORRECTION

PATENT NO. : 5,660,697

DATED : August 26, 1997

INVENTOR(S) : Kawashima et al.

It is certified that error appears in the above-identified patent and that said Letters Patent is hereby corrected as shown below:

Column 5, line 32, "time" should read --times--.

Signed and Sealed this

Seventeenth Day of March, 1998

Attest:

BRUCE LEHMAN

Attesting Officer

Commissioner of Patents and Trademarks